(12) United States Patent
Kang et al.

(10) Patent No.: US 10,403,555 B2
(45) Date of Patent: Sep. 3, 2019

(54) THREE DIMENSIONAL INTEGRATED CIRCUIT HAVING REDUNDANT THROUGH SILICON VIA BASE ON ROTATABLE CUBE

(71) Applicant: INDUSTRY-ACADEMIC COOPERATION FOUNDATION, YONSEI UNIVERSITY, Seoul (KR)

(72) Inventors: Sungho Kang, Seoul (KR); Minho Cheong, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 15/894,787

(22) Filed: Feb. 12, 2018

(65) Prior Publication Data

US 2019/0181061 A1 Jun. 13, 2019

(30) Foreign Application Priority Data

Dec. 13, 2017 (KR) .......................... 10-2017-0171057

(51) Int. Cl.
*H01L 23/525* (2006.01)
*H01L 21/66* (2006.01)
(Continued)

(52) U.S. Cl.
CPC ............ *H01L 22/22* (2013.01); *H01L 23/481* (2013.01); *H01L 23/52* (2013.01); *H01L 23/525* (2013.01);
(Continued)

(58) Field of Classification Search
CPC ............... H01L 23/538; H01L 23/5382; H01L 23/5384; H01L 23/5386; H01L 2225/06541; H01L 22/22; H01L 23/481; H01L 23/482; H01L 23/52; H01L 23/5226; H01L 23/525
See application file for complete search history.

(56) References Cited

U.S. PATENT DOCUMENTS 9,401,312 B1 * 7/2016 Kannan .............. H03K 19/1735
2011/0309519 A1 * 12/2011 Kim .................... H01L 25/0657
257/774
(Continued)

FOREIGN PATENT DOCUMENTS

KR 10-1503737 B1 3/2015
KR 10-1737264 B1 5/2017

OTHER PUBLICATIONS

Jiang et al.; "On Effective Through-Silicon Via Repair for 3-D-Stacked ICs"; IEEE Transactions on Computer-Aided Design of Integrated Circuits and Systems, vol. 32, No. 4; 2013; 13 pages.
(Continued)

*Primary Examiner* — Eduardo A Rodela

(57) ABSTRACT

Exemplary embodiments of the present invention provides a three dimensional integrated circuit and a method for repairing the three dimensional integrated circuit which dispose a signal through silicon via (STSV) or a redundant through silicon via (RTSV) for each basic unit in which a through silicon via (TSV) and a switch are combined and connect repair paths among the basic units to efficiently repair a defective through silicon via which exists in a dense area by using a small number of redundant resources.

10 Claims, 12 Drawing Sheets

(51) Int. Cl.
*H01L 23/48* (2006.01)
*H01L 25/065* (2006.01)
*H01L 23/538* (2006.01)
*H01L 23/52* (2006.01)
*H01L 23/522* (2006.01)

(52) U.S. Cl.
CPC ...... *H01L 23/5226* (2013.01); *H01L 23/5382* (2013.01); *H01L 23/5386* (2013.01); *H01L 25/0657* (2013.01); *H01L 2225/06527* (2013.01); *H01L 2225/06544* (2013.01)

(56) References Cited

U.S. PATENT DOCUMENTS

2013/0230932 A1* 9/2013 Bringivijayaraghavan ................. H01L 22/22
438/4
2017/0229381 A1* 8/2017 Kang .................... H01L 23/481

OTHER PUBLICATIONS

Lo et al.; "Architecture of Ring-based Redundant TSV for Clustered Faults"; Design, Authomation & Test in Erupoe Conference & Exhibition; 2015; 6 pages.

* cited by examiner

[FIG. 1]
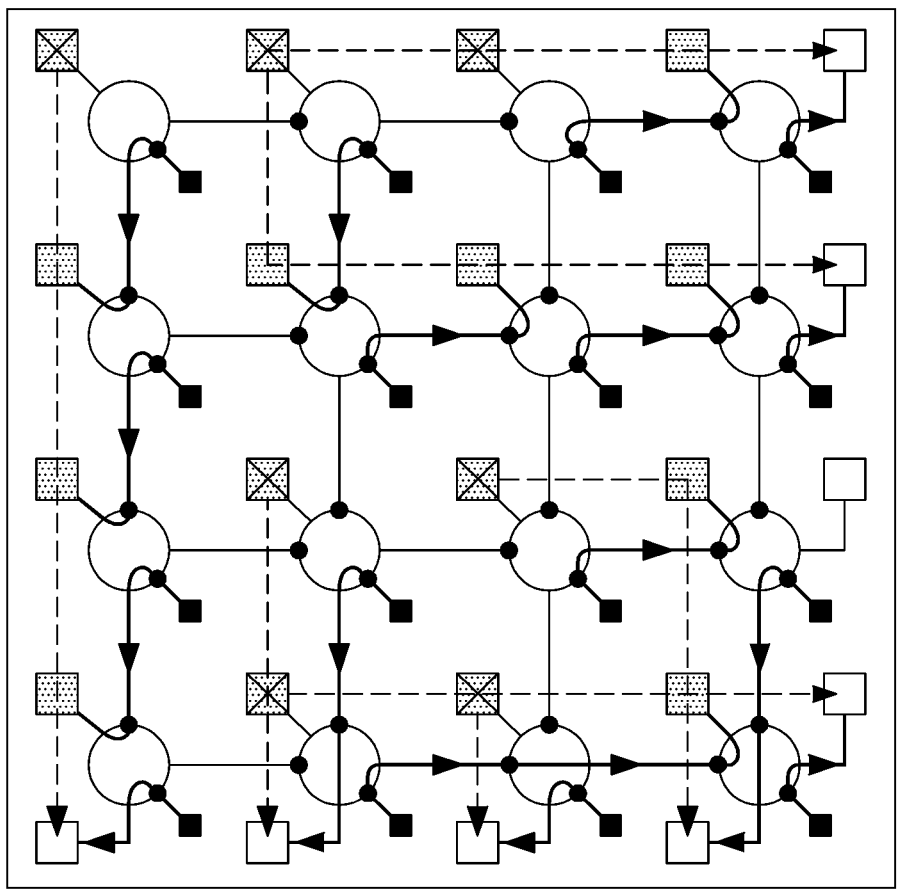

[FIG. 2]
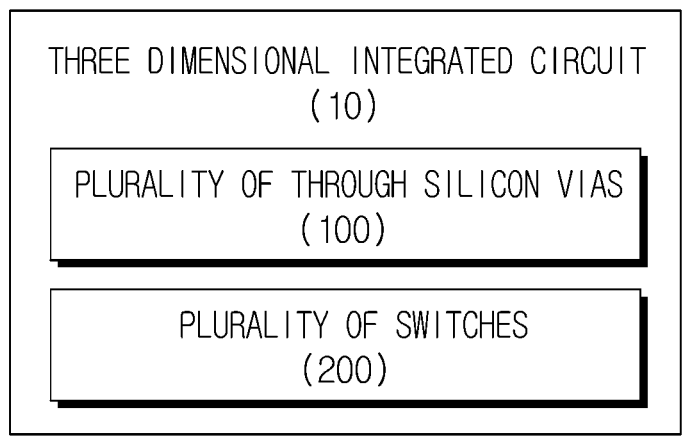

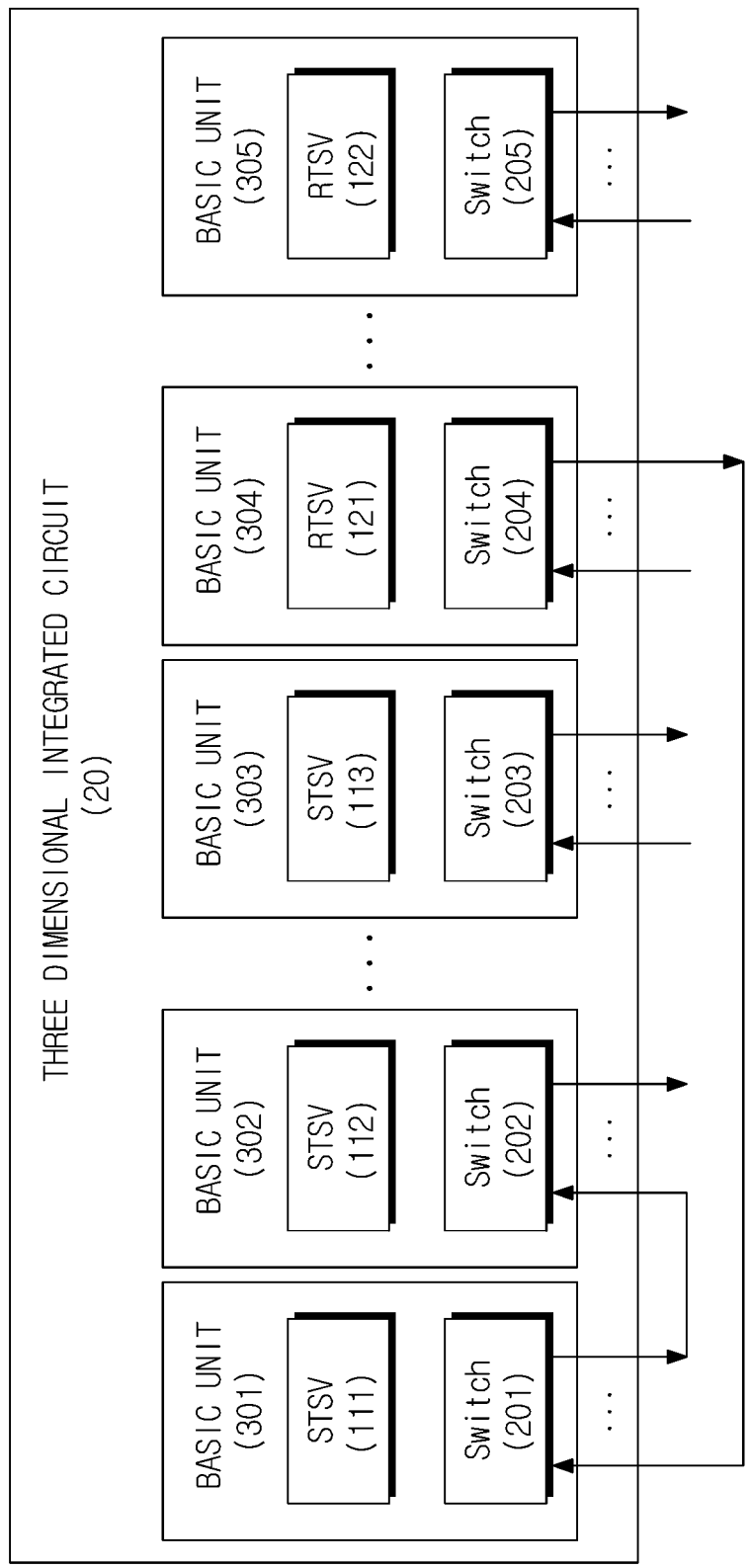

[FIG. 4]
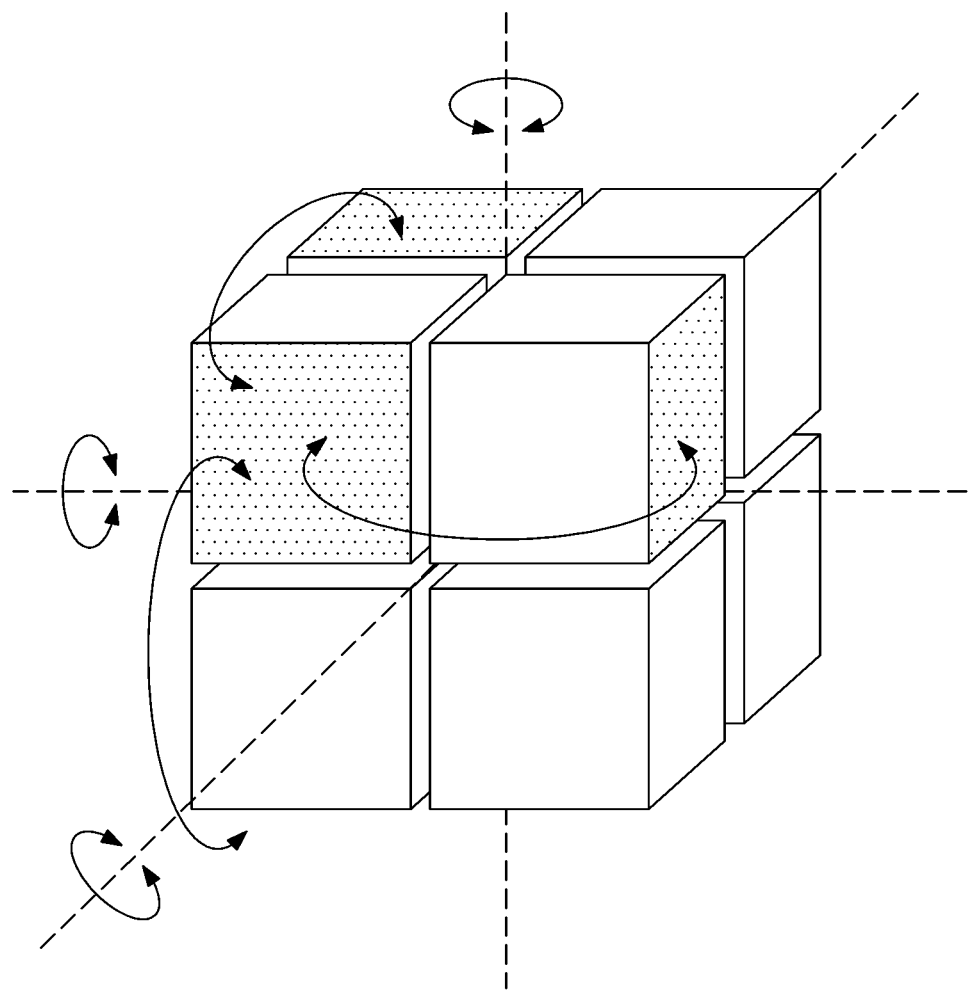

[FIG. 5]
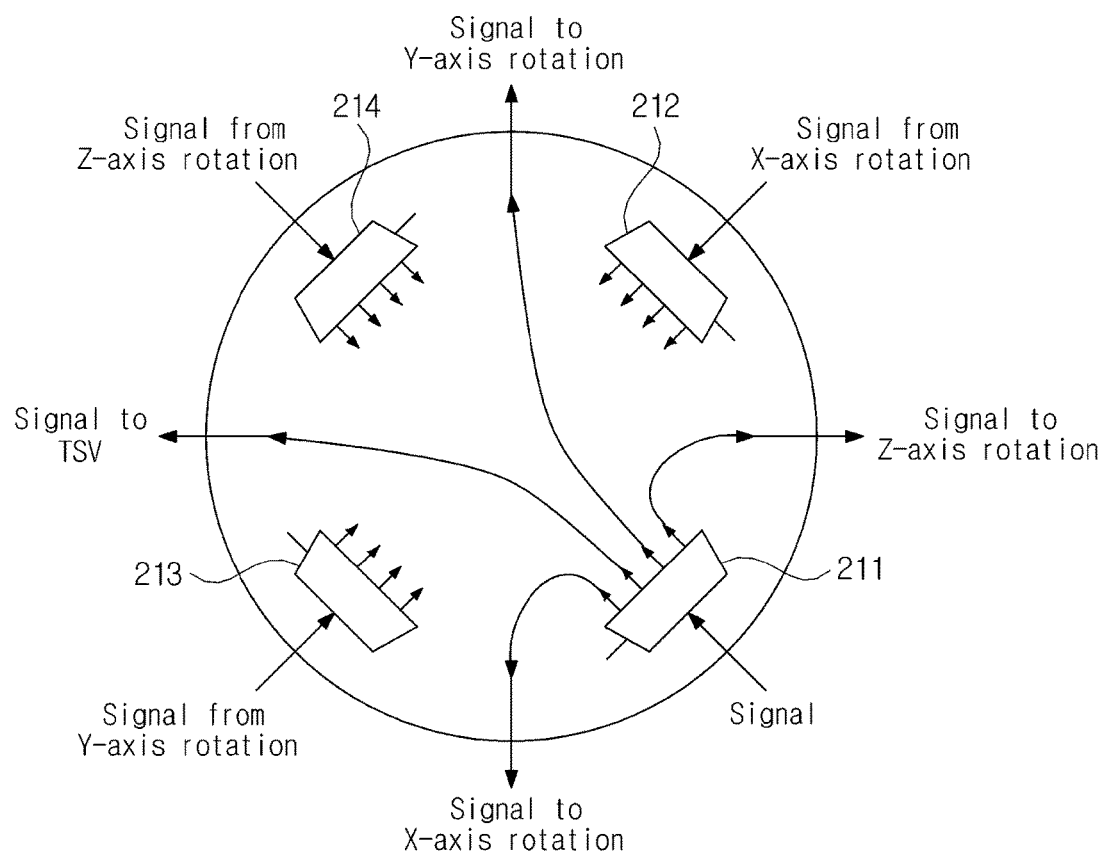

[FIG. 6]
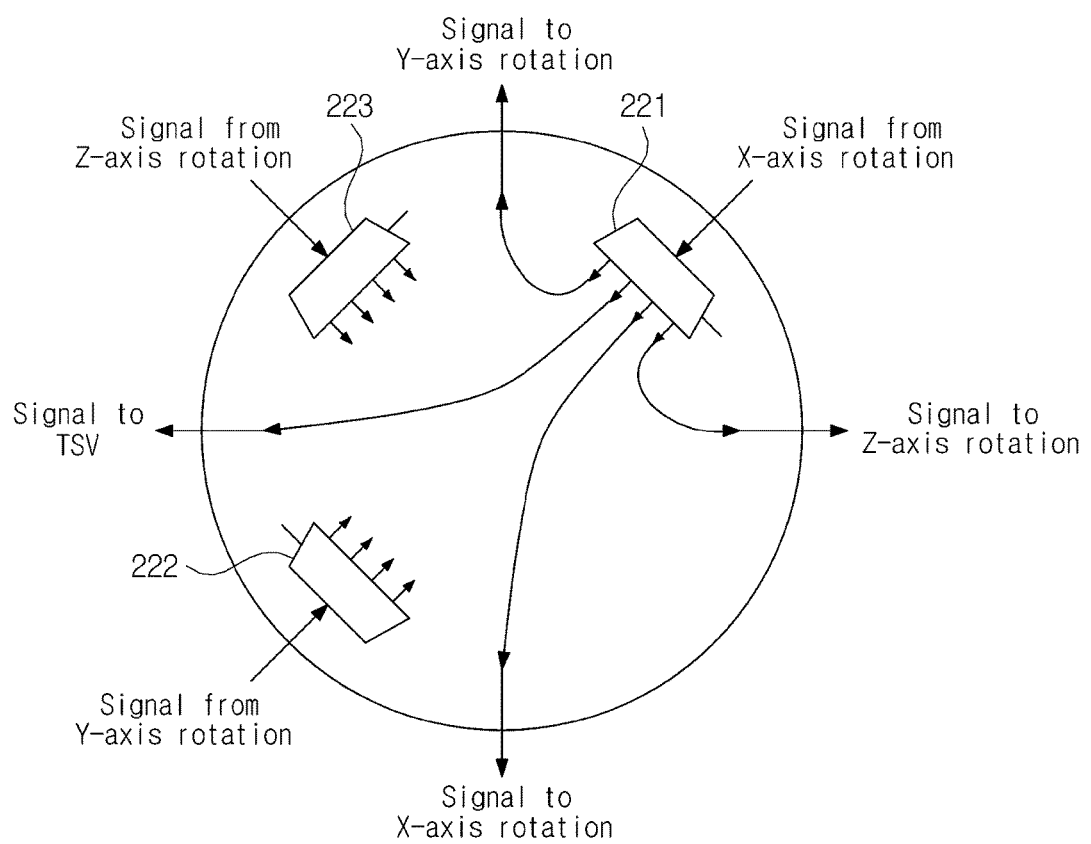

[FIG. 7]
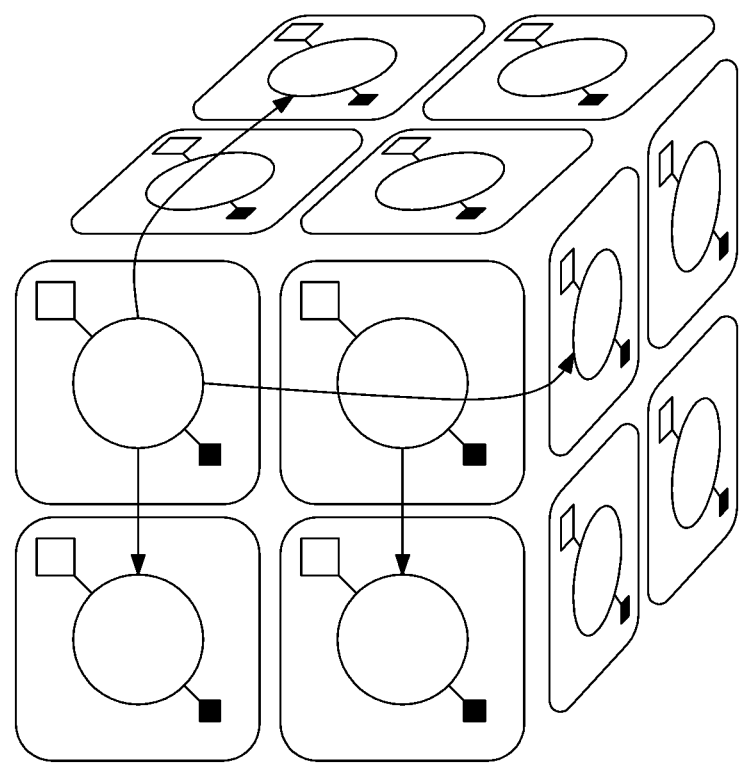

[FIG. 8]
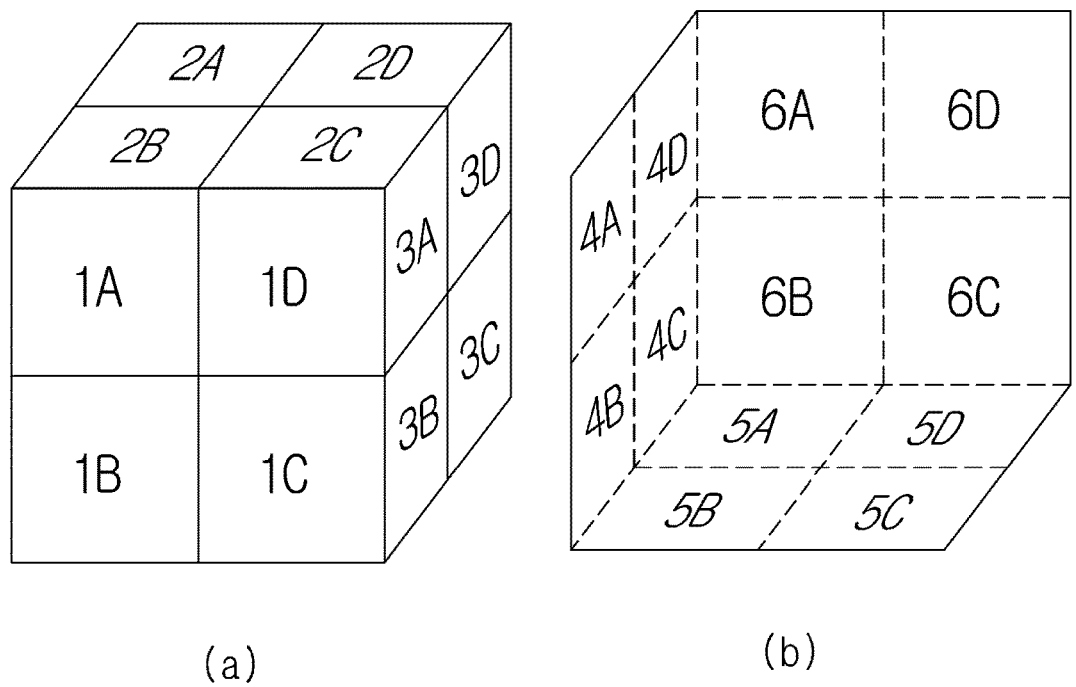
(a)  (b)

[FIG. 9]

| From | To | From | To | From | To | From | To | From | To | From | To |
|---|---|---|---|---|---|---|---|---|---|---|---|
| 1A | 1B | 2A | 2B | 3A | 3B | 4A | B4B | 5A | 5B | 6A | 6B |
|  | 3A |  | 3D |  | 6D |  | 5B |  | 1B |  | 5A |
|  | 2A |  | 6B |  | 2B |  | 1D |  | 4D |  | 4A |
| 1B | 1C | 2B | 2C | 3B | 3C | 4B | 4C | 5B | 5C | 6B | 6C |
|  | 2B |  | 6A |  | 2C |  | 6B |  | 3B |  | 3C |
|  | 4C |  | 4B |  | 1B |  | 5C |  | 1A |  | 5B |
| 1C | 1D | 2C | 2D | 3C | 3D | 4C | 4D | 5C | 5D | 6C | 6D |
|  | 4B |  | 4A |  | 1C |  | 2A |  | 6C |  | 2D |
|  | 5D |  | 1C |  | 5A |  | 6C |  | 3A |  | 3B |
| 1D | 1A | 2D | 2A | 3D | 3A | 4D | 4A | 5D | 5A | 6D | 6A |
|  | 5C |  | 1D |  | 5D |  | 1A |  | 4C |  | 4D |
|  | 3D |  | 3C |  | 6A |  | 2D |  | 6D |  | 2C |

[FIG. 10]
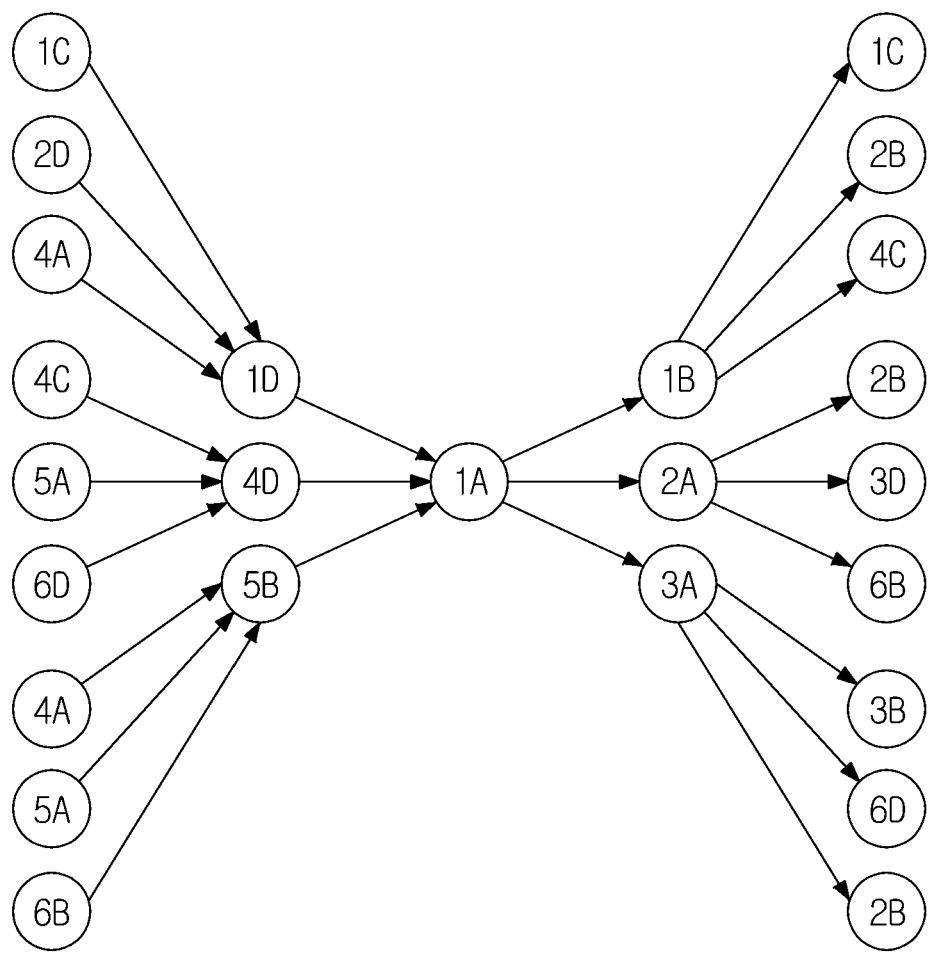

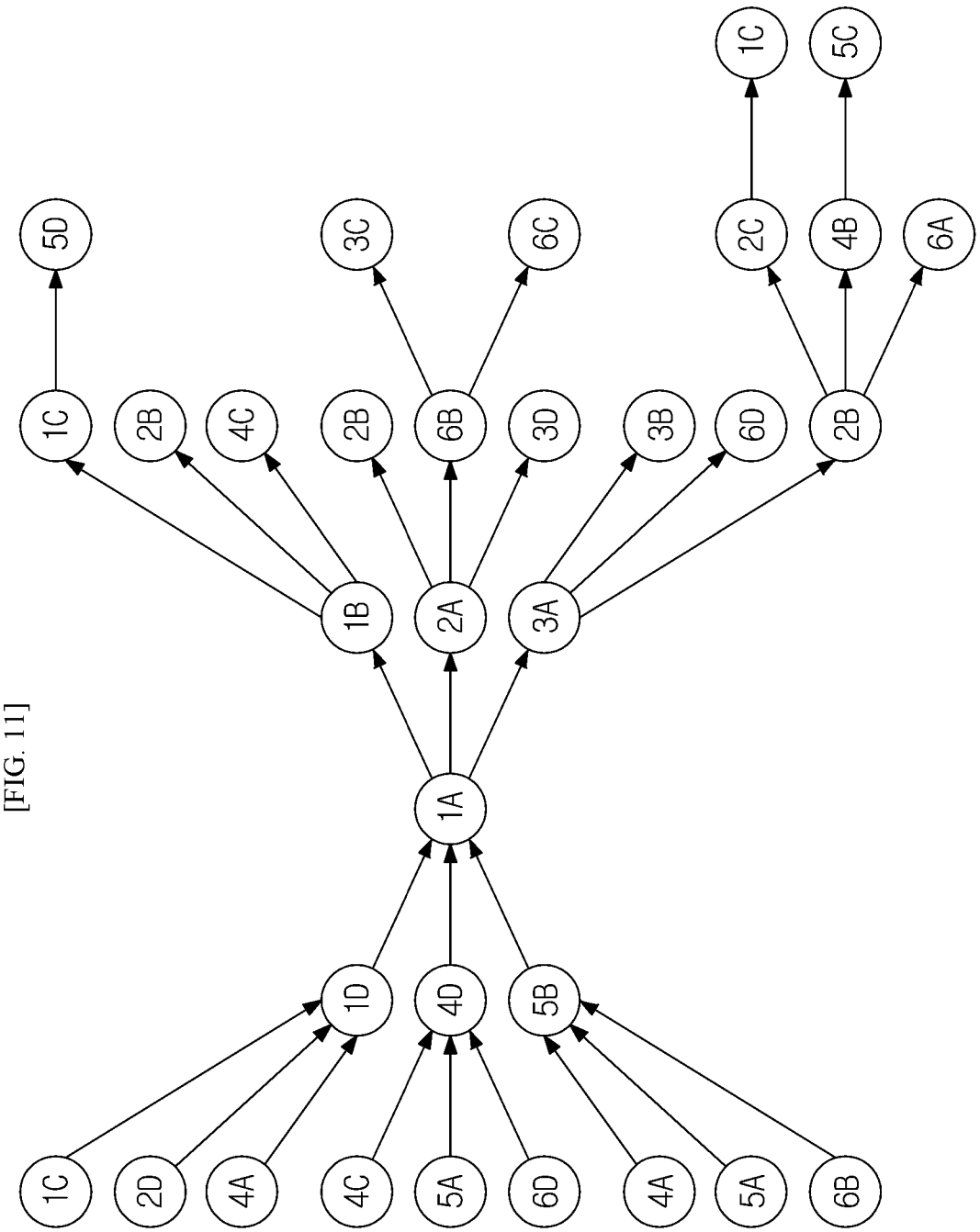
[FIG. 11]

[FIG. 12]
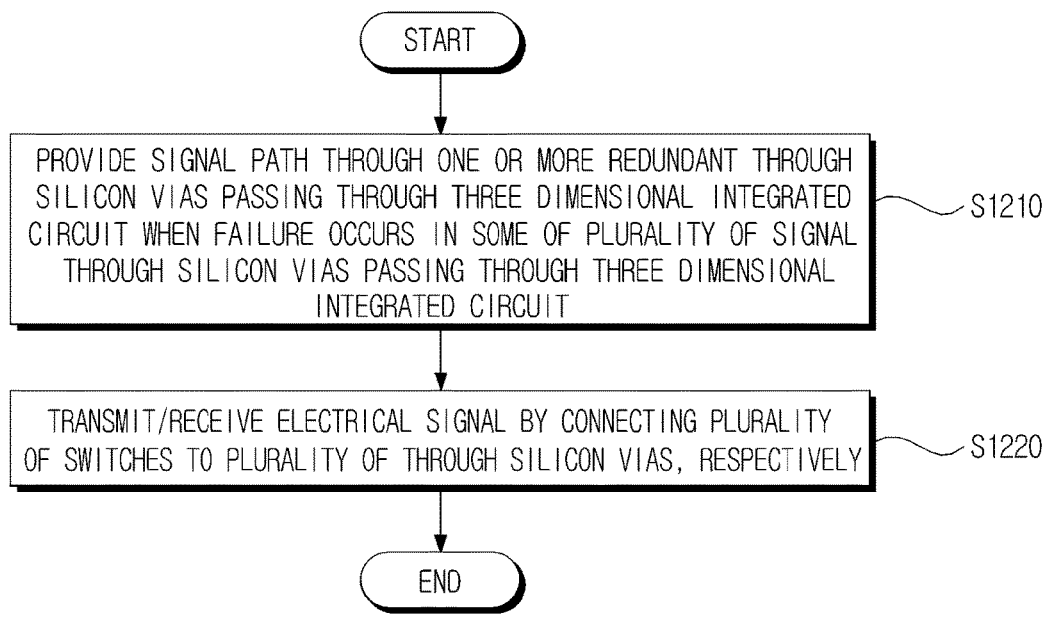

THREE DIMENSIONAL INTEGRATED CIRCUIT HAVING REDUNDANT THROUGH SILICON VIA BASE ON ROTATABLE CUBE

CROSS-REFERENCE TO RELATED APPLICATIONS

This application claims priority to and the benefit of Korean Patent Application No. 10-2017-0171057 filed in the Korean Intellectual Property Office on Dec. 13, 2017, the entire contents of which are incorporated herein by reference.

TECHNICAL FIELD

The present invention relates to a three dimensional integrated circuit having a redundant through silicon via. The present invention corresponds to a middle-grade researcher support project conducted with the support of the Ministry of Science, Technology, Information and Communication and the Korea Research Foundation in 2017 (No. 2017043199).

BACKGROUND ART

Contents described in this section merely provide background information on the present embodiment and do not constitute the related art.

Recently, the sizes and operating voltage of electronic devices have been decreased due to high capacity, light weight, and high density tendencies of electronic products. Planar 2D mounting in the related art has limitations in solving a problem of an increased package area due to slow signal propagation and increased I/O pads.

In order to overcome the limitations, a three dimensional packaging method in which integrated circuits (ICs) are vertically stacked and mounted has attracted attention. Through silicon vias (TSV) are used, which are used as electrical paths by forming through holes in silicon wafers.

The through silicon vias may cause various defects. For example, in a process of forming the through silicon vias, there are a void defect which occurs because a conductive material cannot be completely filled in the through silicon vias, a bump contact fail which occurs as a semiconductor chip is bent or a bump material moves, a crack defect of the through silicon vias, and the like.

Since the through silicon vias serve as a medium for electrically connecting a plurality of semiconductor chips. Therefore, when the defect occurs, the through silicon vias cannot normally show a function as an electrode. In order to cope with such a case, there is a need for a repair technique for replacing a defective through silicon via with a normal through silicon via.

SUMMARY OF THE INVENTION

Exemplary embodiments of the present invention have been made in an effort to dispose a signal through silicon via (STSV) or a redundant through silicon via (RTSV) for each basic unit in which a through silicon via (TSV) and a switch are combined and connect repair paths among the basic units to satisfy a repair rate of 100% with respect to defective through silicon vias of the same number as and a smaller number than the redundant through silicon vias.

Other objects of the present invention, which are not explicitly described, may be additionally considered within the scope which can be easily deduced from the following detailed description and the effects thereof.

An exemplary embodiment of the present invention provides a three dimensional integrated circuit including: a plurality of through silicon vias having a plurality of signal through silicon vias passing through the three dimensional integrated circuit and one or more redundant through silicon vias; and a plurality of switches connected to the plurality of through silicon vias, respectively to transmit/receive an electrical signal.

In the three dimensional integrated circuit, a basic unit may be formed by combining (i) one of the plurality of signal through silicon vias and one or more redundant through silicon vias and (ii) one of the plurality of switches, and one basic unit may be connected to a plurality of different basic units, and may transmit the electrical signal to some basic units among a plurality of different basic units and receive the electrical signal from the remaining basic units among the plurality of basic units.

In the three dimensional integrated circuit, the total number of the plurality of switches may be a number acquired by totaling the number of the plurality of signal through silicon vias and the number of one or more redundant through silicon vias, and each of the plurality of switches may include a demultiplexer and each demultiplexer may form the signal path for transferring the electrical signal to (i) one of the plurality of through silicon vias and (ii) some of the plurality of switches.

In the three dimensional integrated circuit, the demultiplexer included in the switch connected to the through silicon via may include four output terminals that transfer the electrical signal to (i) the through silicon via connected to the switch including the demultiplexer, (ii) the switch connected in a first direction, (iii) the switch connected in a second direction, and (iv) the switch connected in a third direction.

In the three dimensional integrated circuit, the switch connected to the signal through silicon via among the plurality of switches may include: four input terminals that receive the electrical signal from (i) the signal terminal which exists in the basic unit at which one switch is positioned, (ii) the switch connected in the first direction, (iii) the switch connected in the second direction, and (iv) the switch connected in the third direction.

In the three dimensional integrated circuit, the switch connected to the redundant through silicon via among the plurality of switches may include: three input terminals that receive the electrical signal from (i) the switch connected in the first direction, (ii) the switch connected in the second direction, and (iii) the switch connected in the third direction.

Another exemplary embodiment of the present invention provides a method for repairing a three dimensional integrated circuit having a plurality of through silicon vias, including: providing a signal path through one or more redundant through silicon vias passing through the three dimensional integrated circuit when a failure occurs in some of a plurality of signal through silicon vias passing through the three dimensional integrated circuit; and transmitting/receiving an electrical signal by connecting a plurality of switches to the plurality of through silicon vias, respectively.

In the method for repairing the three dimensional integrated circuit, a basic unit may be formed by combining (i) one of the plurality of signal through silicon vias and one or more redundant through silicon vias and (ii) one of the plurality of switches, and one basic unit may be connected to a plurality of different basic units, and may transmit the electrical signal to some basic units among a plurality of different basic units and receive the electrical signal from the remaining basic units among the plurality of basic units.

In the method for repairing the three dimensional integrated circuit, the total number of the plurality of switches may be a number acquired by totaling the number of the plurality of through silicon vias and the number of one or more redundant through silicon vias, and each of the plurality of switches may include a demultiplexer and each demultiplexer may form the signal path for transferring the electrical signal to (i) one of the plurality of through silicon vias and (ii) some of the plurality of switches.

In the method for repairing the three dimensional integrated circuit, the demultiplexer included in the switch connected to the through silicon via may include four output terminals that transfer the electrical signal to (i) the through silicon via connected to the switch including the demultiplexer, (ii) the switch connected in a first direction, (iii) the switch connected in a second direction, and (iv) the switch connected in a third direction.

In the method for repairing the three dimensional integrated circuit, the switch connected to the signal through silicon via among the plurality of switches may include: four input terminals that receive the electrical signal from (i) the signal terminal which exists in the basic unit at which one switch is positioned, (ii) the switch connected in the first direction, (iii) the switch connected in the second direction, and (iv) the switch connected in the third direction.

In the method for repairing the three dimensional integrated circuit, the switch connected to the redundant through silicon via among the plurality of switches may include: three input terminals that receive the electrical signal from (i) the switch connected in the first direction, (ii) the switch connected in the second direction, and (iii) the switch connected in the third direction.

As described above, according to exemplary embodiments of the present invention, a signal through silicon via (STSV) or a redundant through silicon via (RTSV) is disposed for each basic unit in which a through silicon via (TSV) and a switch are combined and repair paths are connected among the basic units to satisfy a repair rate of 100% with respect to defective through silicon vias of the same number as and a smaller number than the redundant through silicon vias and efficiently repair the defective through silicon via which exists in a dense area by using redundant resources of the same number.

Even if the effects are not expressly mentioned here, the effects described in the following specification, which are expected by the technical characteristics of the present invention, and their potential effects are treated as described in the specification of the present invention.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 1 is a diagram illustrating through silicon vias repaired by a router method in the related art.

FIGS. 2 and 3 are block diagrams illustrating a repairable three dimensional integrated circuit according to exemplary embodiments of the present invention.

FIG. 4 is a diagram illustrating a virtual three dimensional cube of the repairable three dimensional integrated circuit according to an exemplary embodiment of the present invention.

FIGS. 5 and 6 are diagrams illustrating a switch of the repairable three dimensional integrated circuit according to exemplary embodiments of the present invention.

FIG. 7 is a diagram in which a basic unit of the repairable three dimensional integrated circuit is disposed in the virtual three dimensional cube according to an exemplary embodiment of the present invention.

FIG. 8 is a diagram in which a virtual division plane of the virtual three dimensional cube of the repairable three dimensional integrated circuit is numbered according to an exemplary embodiment of the present invention.

FIG. 9 is a table showing a signal path between the virtual division planes of the repairable three dimensional integrated circuit according to an exemplary embodiment of the present invention.

FIGS. 10 and 11 are diagrams illustrating the signal path between the basic units disposed on a virtual division plane of the repairable three dimensional integrated circuit according to an exemplary embodiment of the present invention.

FIG. 12 is a flowchart illustrating a method for repairing a three dimensional integrated circuit according to another exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, in describing the present invention, a detailed explanation of known technologies associated with the present invention, which is apparent to those skilled in the art may be omitted to avoid unnecessarily obscuring the subject matter of the present invention and some exemplary embodiments of the present invention will be described in detail through illustrative drawings.

FIG. 1 is a diagram illustrating through silicon vias repaired by a router method in the related art. Referring to FIG. 1, twenty-four through silicon vias (TSV) constitute one group. The through silicon vias repaired by the router method in the related art include 16 signal through silicon vias (STSV) and 8 redundant through silicon vias (RTSV). Each of the through silicon vias includes 3 multiplexers having 3 input terminals. The multiplexer may selectively apply a signal to the through silicon vias neighboring to each other in a right direction or a lower direction. When a failure of the through silicon via is discovered in a group, a repair path from a corresponding position up to the redundant through silicon via (RTSV) is calculated by the router method in the related art and the signal is transmitted to the neighboring through silicon vias in the router method in the related art. In the router method in the related art, there is a problem in that there is a failure pattern which is impossible to repair in the group.

FIGS. 2 and 3 are block diagrams illustrating a repairable three dimensional integrated circuit. As illustrated in FIG. 2, the three dimensional integrated circuit 10 includes a plurality of through silicon vias 100 and a plurality of switches 100. In the three dimensional integrated circuit 10, some components may be omitted from various constituent elements exemplarily illustrated in FIG. 2 or other constituent elements may be additionally included. The three dimensional integrated circuit may additionally include a virtual division area or additionally include a signal controller. The three dimensional integrated circuit may be implemented as a semiconductor chip and may be a memory chip or a processor chip, but is not limited thereto.

The plurality of through silicon vias 100 includes a plurality of signal through silicon vias and one or more redundant through silicon vias. The through via may be a through silicon via (TSV) formed by vertically penetrating a silicon layer (not illustrated) insulated in the three dimensional integrated circuit. The through vias may be arranged to form multiple rows and columns. The row and the column are not particularly vertically aligned, but arranging multiple rows and columns means a structure in which the plurality of through vias is arranged in different directions. The plurality of through silicon vias 100 and a plurality of switches 200 may form the group.

The plurality of switches 200 are connected to the plurality of through silicon vias 200, respectively to transmit/receive electrical signals. The three dimensional integrated circuit includes the switches 200 and signal ports (not illustrated). Switches SW may be connected to the through vias one to one and may switch respective signals from the signal ports to different through vias or switch the respective signals from the through vias to different signal ports. The signal ports may input the signals to the through vias through the switches or receive the signals from the through vias through the switches. The switches may be provided to an upper part and a lower part of the through vias and may be implemented at appropriate positions by considering a signal flow and a distance between the through vias.

Referring to FIG. 3, a plurality of through silicon vias 111, 112, 113, 121, and 122 and a plurality of switches 201, 202, 203, 204, and 204 may form a structure in which the plurality of through silicon vias and the plurality of switches are connected based on a virtual three dimensional cube.

The three dimensional integrated circuit 20 forms basic units 301, 302, 303, 304, and 305 by combining (i) one of the plurality of signal through silicon vias 111, 112 and 113 and one or more redundant through silicon vias 121 and 122 and (ii) one of the plurality of switches. One basic unit is connected to a plurality of different basic units, and transmits the electrical signal to some basic units among a plurality of different basic units and receives the electrical signal from the remaining basic units among the plurality of basic units.

The basic units 301, 302, 303, 304, and 305 are disposed in areas acquired by dividing a plane of the virtual three dimensional cube, respectively. In the three dimensional integrated circuit 20, (i) one of the plurality of signal through signal vias 111, 112 and 113 and one or more redundant through silicon vias 121 and 122 and (ii) one of the plurality of switches 201, 202, 203, 204, and 204 are disposed in areas acquired by dividing the plane of the virtual three dimensional cube. The total number of the plurality of switches 201, 202, 203, 204, and 204 is the same as a number acquired by totaling the number of the plurality of through silicon vias 111, 112, and 113 and the number of one or more redundant through silicon vias 121 and 122.

The plurality of through silicon vias 111, 112, 113, 121, and 122 and the plurality of switches 201, 202, 203, 204, and 204 form a signal path in which the electrical signal is transmitted/received between (i) areas acquired by dividing the plane of the virtual three dimensional cube and (ii) corresponding areas by rotating the areas acquired by dividing the plane of the virtual three dimensional cube based on a virtual axis passing through a center of the virtual three dimensional cube. An example of the rotatable three dimensional cube is illustrated in FIG. 4.

The virtual three dimensional cube is a structure in which the areas acquired by dividing the plane of the virtual three dimensional cube are rotated to move to the other plane of the virtual three dimensional cube, the areas acquired by dividing the plane of the virtual three dimensional cube which moves to the other plane are rotated to move to another plane of the virtual three dimensional cube, and the areas acquired by dividing the plane of the virtual three dimensional cube move to all planes of the virtual three dimensional cube. For example, the rotatable three dimensional cube is a 2×2×2 Rubik's cube shape.

Each of the plurality of switches includes a demultiplexer, wherein each demultiplexer forms the signal path for transferring the electrical signal to (i) one of the plurality of through silicon vias and (ii) some of the plurality of switches.

The three dimensional integrated circuit may include the signal controller. The signal controller controls the demultiplexers of the switches. The signal controller selects a flow of the signal on the signal path formed by the demultiplexers by considering a failure of the through via.

FIG. 4 is a diagram illustrating a virtual three dimensional cube of the repairable three dimensional integrated circuit. Referring to FIG. 4, the virtual three dimensional cube is a hexahedron and each plane of the hexahedron is divided into four halves in a cross shape.

The plurality of through silicon vias may be disposed in 24 division areas, respectively, four redundant through silicon vias may be disposed on one plane, and 20 signal through silicon vias may be disposed on 5 remaining planes.

The plurality of through silicon vias may be disposed in 24 division areas, respectively, 8 redundant through silicon vias may be disposed on 2 plane, and 16 signal through silicon vias may be disposed on 4 remaining planes.

The through silicon vias disposed in plane are rearranged in the three dimensional cube illustrated in FIG. 4. An arrow indicates a movable path of the signal. The signal that moves to another divided plane using a rotation structure may also move to another divided plane again. Since one divided plane may move even to positions of all divided planes in an entire three dimension, the signal at a specific position may move to all redundant through silicon vias (RTSV) in the structure of FIG. 4 to satisfy a repair rate of 100%.

FIGS. 5 and 6 are diagrams illustrating a switch of the repairable three dimensional integrated circuit. Each of the plurality of switches illustrated in FIG. 5 includes 4 demultiplexers 211, 212, 213, and 214. Each of the plurality of switches illustrated in FIG. 6 includes 3 demultiplexers 221, 222, and 223. Each of the demultiplexers 211, 212, 213, 214, 221, 222, and 223 forms the signal path for transferring the electrical signal to (i) one of the plurality of through silicon vias and (ii) some of the plurality of switches.

The respective signals may move to the switches positioned on the movable divided planes when being rotated based on the through silicon via, an X axis, a Y axis, and a Z axis which exist on the same divided plane as the signal in a total of 4 directions, respectively. As the signals that may be received by each switch, received signals in three directions when rotating based on the X axis, the Y axis, and the Z axis or a signal directly received from the same divided plane (an area where the basic unit is disposed) is additionally included to receive 4 signals. The received signals are movable to 4 paths through 4-output demultiplexers, respectively and the switch includes 3 or 4 4-output demultiplexers.

The demultiplexer includes: 4 output terminals that transfer the electrical signal to (i) a through silicon via which exists in the same divided area where the switch including the demultiplexer is positioned, (ii) a switch which exists in the corresponding divided area by rotation in a first direction, (iii) a switch which exists in the corresponding divided area by rotation in a second direction, and (iv) a switch which exists in the corresponding divided area by rotation in a third direction. For example, each of the first direction, the second direction, and the third direction may be the X axis, the Y axis, the Z axis, or an axis in which the axes are combined at a certain ratio.

That is, the demultiplexer included in the switch connected to the through silicon via includes four output terminals that transfer the electrical signal to the (i) the through silicon via connected to the switch including the demultiplexer, (ii) the switch connected in the first direction, (iii) the switch connected in the second direction, and (iv) the switch connected in the third direction.

Referring to FIG. 5, the switch connected to the signal through silicon via among the plurality of switches includes: 4 input terminals that receive the electrical signal from (i) a signal terminal which exists in the divided area which is the same as an area at which one switch is positioned, (ii) the switch which exists in the corresponding divided area by rotation in the first direction, (iii) the switch which exists in the corresponding divided area by rotation in the second direction, and (iv) the switch which exists in the corresponding divided area by rotation in the third direction.

That is, the switch connected to the signal through silicon via among the plurality of switches includes: four input terminals that receive the electrical signal from (i) the signal terminal which exists in the basic unit at which one switch is positioned, (ii) the switch connected in the first direction, (iii) the switch connected in the second direction, and (iv) the switch connected in the third direction.

Referring to FIG. 6, the switch connected to the redundant through silicon via among the plurality of switches includes: 3 input terminals that receive the electrical signal from (i) the switch which exists in the corresponding divided area by rotation in the first direction, (ii) the switch which exists in the corresponding divided area by rotation in the second direction, and (iii) the switch which exists in the corresponding divided area by rotation in the third direction.

That is, the switch connected to the redundant through silicon via among the plurality of switches includes: three input terminals that receive the electrical signal from (i) the switch connected in the first direction, (ii) the switch connected in the second direction, and (iii) the switch connected in the third direction.

Hereinafter, the connection and the signal flow between the basic units disposed on 24 divided planes will be described with reference to FIGS. 7 to 11.

FIG. 7 is a diagram in which a basic unit of the repairable three dimensional integrated circuit is disposed in the virtual three dimensional cube, FIG. 8 is a diagram in which a virtual division plane of the virtual three dimensional cube of the repairable three dimensional integrated circuit is numbered, and FIG. 9 is a table showing a signal path.

The basic unit including a TSV positioned on divided plane 1A and the switch transmits the signal to divided planes 1B, 3A, and 2A. The basic units positioned on divided planes 1B, 1C, 1D, 2A, 2B, 2C, 2D, 3A, 3B, 3C, 3D, 4A, 4B, 4C, 4D, 5A, 5B, 5C, 5D, 6A, 6B, 6C, and 6D also transmit the signal to the basic units positioned on divided planes referred in the table.

FIGS. 10 and 11 are diagrams illustrating basic units connected based on divided plane 1A. The basic unit disposed on each divided plane receives the signal from the switches positioned in three directions and outputs the signal to the switches positioned in three directions. The basic unit disposed on the divided plane 1A may be connected to all basic units, that is, all switches. Three basic units are connected to each of a front side and a rear side based on one basic unit and three basic units are connected to each of the front side and the rear side again. Among the plurality of basic units, the RTSV and the STSV are connected and disposed according to the number of RTSVs set according to a system requirement. 1C connected from 1A in 2 stages is connected to 5D, 6B connected from 1A in 2 stages is connected to 3C and 6C, 2B connected from 1A in 2 stages is connected to 2C, 4B, and 6A, and 4B connected from 1A in 3 stages is connected to 5C. All basic units may be connected within a range of stage 1 to 6.

In the three dimensional integrated circuit according to the exemplary embodiment, repair efficiency of a three dimensional semiconductor may be increased by disposing the redundant through silicon via and setting the repair path so as to repair any failure regardless of density by using such a switch structure and the demultiplexer.

Constituent elements included in the three dimensional integrated circuit are separately illustrated in FIGS. 2 and 3, but a plurality of constituent elements may be combined with each other and implemented as at least one module. The constituent elements are connected to a communication path connecting a software module or a hardware module inside the apparatus and operate organically with each other. The constituent elements communicate using one or more communication buses or signal lines.

The three dimensional integrated circuit may be implemented in a logic circuit by hardware, firmware, software, or a combination thereof, and may be implemented using a universal or special purpose computer. The apparatus may be implemented using a hardwired device, a field programmable gate array (FPGA), an application specific integrated circuit (ASIC), or the like. In addition, the apparatus may be implemented as a System on Chip (SoC) including one or more processors and controllers.

The three dimensional integrated circuit may be mounted as software, hardware, or a combination type thereof in a computing device having hardware components. The computing device may mean various devices which include all or some of a communication device such as a communication modem for performing communication with various devices or wired/wireless communication networks, a memory for storing data for executing a program, a microprocessor for performing a computation and commanding by executing a program.

FIG. 12 is a flowchart illustrating a method for repairing a three dimensional integrated circuit according to another exemplary embodiment of the present invention. The method for repairing the three dimensional integrated circuit may be performed by the three dimensional integrated circuit.

In step S1210, the three dimensional integrated circuit provides a signal path through one or more redundant through silicon vias passing through the three dimensional integrated circuit when a failure occurs in some of a plurality of signal through silicon vias passing through the three dimensional integrated circuit.

In step S1220, the three dimensional integrated circuit transmits and receives electrical signals by connecting a plurality of switches to a plurality of through silicon vias.

In providing the signal path (S1210), the plurality of through silicon vias and the plurality of switches form a structure in which the plurality of through silicon vias and the plurality of switches are connected based on a virtual three dimensional cube. (i) One of the plurality of signal through silicon vias and one or more redundant through silicon vias and (ii) one of the plurality of switches are disposed in areas acquired by dividing a plane of the virtual three dimensional cube, respectively.

In providing the signal path (S1210), a basic unit is formed by combining (i) one of the plurality of signal through silicon vias and one or more redundant through silicon vias and (ii) one of the plurality of switches. One basic unit is connected to a plurality of different basic units, and transmits the electrical signal to some basic units among a plurality of different basic units and receives the electrical signal from the remaining basic units among the plurality of basic units.

The plurality of through silicon vias and the plurality of switches form a signal path in which the electrical signal is transmitted/received between (i) areas acquired by dividing the plane of the virtual three dimensional cube and (ii) corresponding areas by rotating the areas acquired by dividing the plane of the virtual three dimensional cube based on a virtual axis passing through a center of the virtual three dimensional cube.

The virtual three dimensional cube is a structure in which the areas acquired by dividing the plane of the virtual three dimensional cube are rotated to move to the other plane of the virtual three dimensional cube, the areas acquired by dividing the plane of the virtual three dimensional cube which moves to the other plane are rotated to move to another plane of the virtual three dimensional cube, and the areas acquired by dividing the plane of the virtual three dimensional cube move to all planes of the virtual three dimensional cube. The virtual three dimensional cube may be a hexahedron and each plane of the hexahedron may be divided into four halves in a cross shape. The plurality of through silicon vias may be disposed in 24 division areas, respectively, four redundant through silicon vias are disposed on one plane, and 20 signal through silicon vias may be disposed on 5 remaining planes. The plurality of through silicon vias may be disposed in 24 division areas, respectively, 8 redundant through silicon vias may be disposed on 2 planes, and 16 signal through silicon vias may be disposed on 4 remaining planes.

The total number of the plurality of switches is a number acquired by totaling the number of the plurality of through silicon vias and the number of one or more redundant through silicon vias and each of the plurality of switches includes a demultiplexer. Each demultiplexer forms the signal path for transferring the electrical signal to (i) one of the plurality of through silicon vias and (ii) some of the plurality of switches.

The demultiplexer includes: 4 output terminals that transfer the electrical signal to (i) a through silicon via which exists in the same divided area where the switch including the demultiplexer is positioned, (ii) a switch which exists in the corresponding divided area by rotation in a first direction, (iii) a switch which exists in the corresponding divided area by rotation in a second direction, and (iv) a switch which exists in the corresponding divided area by rotation in a third direction. The demultiplexer included in the switch connected to the through silicon via includes four output terminals that transfer the electrical signal to (i) the through silicon via connected to the switch including the demultiplexer, (ii) the switch connected in the first direction, (iii) the switch connected in the second direction, and (iv) the switch connected in the third direction.

The switch connected to the signal through silicon via among the plurality of switches includes: 4 input terminals that receive the electrical signal from (i) a signal terminal which exists in the same divided area at which one switch is positioned, (ii) the switch which exists in the corresponding divided area by rotation in the first direction, (iii) the switch which exists in the corresponding divided area by rotation in the second direction, and (iv) the switch which exists in the corresponding divided area by rotation in the third direction. That is, the switches connected to the signal through silicon via among the plurality of switches includes: four input terminals that receive the electrical signal from (i) the signal terminal which exists in the basic unit at which one switch is positioned, (ii) the switch connected in the first direction, (iii) the switch connected in the second direction, and (iv) the switch connected in the third direction.

The switch connected to the redundant through silicon via among the plurality of switches includes: 3 input terminals that receive the electrical signal from (i) the switch which exists in the corresponding divided area by rotation in the first direction, (ii) the switch which exists in the corresponding divided area by rotation in the second direction, and (iii) the switch which exists in the corresponding divided area by rotation in the third direction. That is, the switches connected to the redundant through silicon via among the plurality of switches includes: three input terminals that receive the electrical signal from (i) the switch connected in the first direction, (ii) the switch connected in the second direction, and (iii) the switch connected in the third direction.

In FIG. 12, it is disclosed that the respective processes are sequentially executed, but this is just an exemplary description and those skilled in the art will be able to make various modifications and transformations and apply the modifications and transformations by executing the processes by changing an order disclosed in FIG. 12, executing one or more steps in parallel, or adding other processes without departing from an essential characteristic of the exemplary embodiment of the present invention.

Meanwhile, the embodiments according to the present invention may be implemented in the form of program instructions that can be executed by computers, and may be recorded in computer readable media. The computer readable media may include program instructions, a data file, a data structure, or a combination thereof. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. A three dimensional integrated circuit comprising:
    a plurality of through silicon vias having a plurality of signal through silicon vias passing through the three dimensional integrated circuit and one or more redundant through silicon vias; and
    a plurality of switches connected to the plurality of through silicon vias, respectively to transmit/receive an electrical signal,
    wherein each of the plurality of switches includes a demultiplexer, wherein each demultiplexer forms a signal path for transferring an electrical signal to (i) one of the plurality of through silicon vias and (ii) some of the plurality of switches, and
    wherein the demultiplexer included in the switch connected to the through silicon via includes four output terminals that transfer the electrical signal to (i) the through silicon via connected to the switch including the demultiplexer, (ii) the switch connected in a first direction, (iii) the switch connected in a second direction, and (iv) the switch connected in a third direction.

2. The three dimensional integrated circuit of claim 1, wherein a basic unit is formed by combining (i) one of the plurality of signal through silicon vias and the one or more redundant through silicon vias and (ii) one of the plurality of switches,
    wherein one basic unit is connected to a plurality of different basic units, transmits the electrical signal to some basic units among the plurality of different basic units, and receives the electrical signal from the remaining basic units among the plurality of basic units,
    wherein the basic units are disposed in areas acquired by dividing a plane of a virtual three dimensional cube, and
    wherein the plurality of through silicon vias and the plurality of switches form a signal path in which the electrical signal is transmitted or received between (i) the areas acquired by dividing the plane of the virtual three dimensional cube and (ii) corresponding areas by rotating the areas acquired by dividing the plane of the virtual three dimensional cube based on a virtual axis passing through a center of the virtual three dimensional cube.

3. The three dimensional integrated circuit of claim 2, wherein the total number of the plurality of switches is a number acquired by totaling the number of the plurality of signal through silicon vias and the number of the one or more redundant through silicon vias.

4. The three dimensional integrated circuit of claim 1, wherein the switch connected to the signal through silicon via among the plurality of switches includes: four input terminals that receive the electrical signal from (i) the signal terminal which exists in the basic unit at which one switch is positioned, (ii) the switch connected in the first direction, (iii) the switch connected in the second direction, and (iv) the switch connected in the third direction.

5. The three dimensional integrated circuit of claim 1, wherein the switch connected to the redundant through silicon via among the plurality of switches includes: three input terminals that receive the electrical signal from (i) the switch connected in the first direction, (ii) the switch connected in the second direction, and (iii) the switch connected in the third direction.

6. The method of claim 1, wherein the switch connected to the signal through silicon via among the plurality of switches includes: four input terminals that receive the electrical signal from (i) the signal terminal which exists in the basic unit at which one switch is positioned, (ii) the switch connected in the first direction, (iii) the switch connected in the second direction, and (iv) the switch connected in the third direction.

7. The method of claim 1, wherein the switch connected to the redundant through silicon via among the plurality of switches includes: three input terminals that receive the electrical signal from (i) the switch connected in the first direction, (ii) the switch connected in the second direction, and (iii) the switch connected in the third direction.

8. A method for repairing a three dimensional integrated circuit having a plurality of through silicon vias, the method comprising:
    providing a signal path through one or more redundant through silicon vias passing through the three dimensional integrated circuit when a failure occurs in some of a plurality of signal through silicon vias passing through the three dimensional integrated circuit; and
    transmitting/receiving an electrical signal by connecting a plurality of switches to the plurality of through silicon vias, respectively,
    wherein each of the plurality of switches includes a demultiplexer, wherein each demultiplexer forms a signal path for transferring the electrical signal to (i) one of the plurality of through silicon vias and (ii) some of the plurality of switches, and
    wherein the demultiplexer included in the switch connected to the through silicon via includes four output terminals that transfer the electrical signal to (i) the through silicon via connected to the switch including the demultiplexer, (ii) the switch connected in a first direction, (iii) the switch connected in a second direction, and (iv) the switch connected in a third direction.

9. The method of claim 8, wherein a basic unit is formed by combining (i) one of the plurality of signal through silicon vias and the one or more redundant through silicon vias and (ii) one of the plurality of switches,
- wherein one basic unit is connected to a plurality of different basic units, and transmits the electrical signal to some basic units among the plurality of different basic units and receives the electrical signal from the remaining basic units among the plurality of basic units,
- wherein the basic units are disposed in areas acquired by dividing a plane of a virtual three dimensional cube, and
- wherein the plurality of through silicon vias and the plurality of switches form a signal path in which the electrical signal is transmitted or received between (i) the areas acquired by dividing the plane of the virtual three dimensional cube and (ii) corresponding areas by rotating the areas acquired by dividing the plane of the virtual three dimensional cube based on a virtual axis passing through a center of the virtual three dimensional cube.

10. The method of claim 9, wherein the total number of the plurality of switches is a number acquired by totaling the number of the plurality of through silicon vias and the number of the one or more redundant through silicon vias.

* * * * *